(12) United States Patent
He et al.

(10) Patent No.: US 11,002,789 B2
(45) Date of Patent: May 11, 2021

(54) ANALOG CIRCUIT FAULT FEATURE EXTRACTION METHOD BASED ON PARAMETER RANDOM DISTRIBUTION NEIGHBOR EMBEDDING WINNER-TAKE-ALL METHOD

(71) Applicant: WUHAN UNIVERSITY, Hubei (CN)

(72) Inventors: Yigang He, Hubei (CN); Wei He, Hubei (CN); Hui Zhang, Hubei (CN); Liulu He, Hubei (CN); Baiqiang Yin, Hubei (CN); Bing Li, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 321 days.

(21) Appl. No.: 16/166,071

(22) Filed: Oct. 20, 2018

(65) Prior Publication Data
US 2019/0353703 A1  Nov. 21, 2019

(30) Foreign Application Priority Data
May 16, 2018 (CN) .......................... 201810465480.7

(51) Int. Cl.
*G01R 31/316* (2006.01)
*G06F 17/14* (2006.01)

(52) U.S. Cl.
CPC ......... *G01R 31/316* (2013.01); *G06F 17/145* (2013.01); *G06F 17/148* (2013.01)

(58) Field of Classification Search
CPC .... G01R 31/316; G06F 17/145; G06F 17/148
(Continued)

(56) References Cited

U.S. PATENT DOCUMENTS 6,513,004 B1 * 1/2003 Rigazio .................. G10L 15/02
704/236
2006/0277998 A1 * 12/2006 Masotti ............... G01S 7/52036
73/579
(Continued)

FOREIGN PATENT DOCUMENTS

CN        104198924 A  * 12/2014
CN        107798343 A  *  3/2018

OTHER PUBLICATIONS

Alippi et al "SBT soft fault diagnosis in analog electronic circuits: a sensitivity-based approach by randomized algorithms", IEEE Transactions on Instrumentation and Measurement • Nov. 2002 (Year: 2002).*

(Continued)

*Primary Examiner* — Catherine T. Rastovski
*Assistant Examiner* — Aeysha N Sultana
(74) *Attorney, Agent, or Firm* — JCIPRNET

(57) ABSTRACT

An analog circuit fault feature extraction method based on a parameter random distribution neighbor embedding winner-take-all method, comprising the following steps: (1) collecting a time-domain response signal of an analog circuit under test, wherein the input of the analog circuit under test is excited by using a pulse signal, a voltage signal is sampled at an output end, and the collected time-domain response signal is an output voltage signal of the analog circuit; (2) applying a discrete wavelet packet transform for the collected time-domain response signal to acquire each wavelet node signal; (3) calculating energy values and kurtosis values of the acquired wavelet node signals to form an initial fault feature data set of the analog circuit; and (4) analyzing the initial fault feature data by the parameter random distribution neighbor embedding winner-take-all method, to acquire optimum low-dimensional feature data. The invention effectively reduces redundancy and interference ele- (Continued)

ments in the fault features, and greatly improves degree of separation of different fault features and degree of polymerization of samples of same fault category.

4 Claims, 6 Drawing Sheets

(58) Field of Classification Search
USPC .......................................................... 702/58
See application file for complete search history.

(56) References Cited

U.S. PATENT DOCUMENTS

2014/0146234 A1* 5/2014 Chou ..................... H04B 10/67
348/571
2018/0348998 A1* 12/2018 Mueller ................. G06N 5/022

OTHER PUBLICATIONS

Wang et al., "Wavelet-Based Feature Extraction in Fault Diagnosis for Biquad High-Pass Filter Circuit", Mathematical Problems in Engineering (Year: 2016).*
Perez et al., "Using Wavelets for Feature Extraction and Self Organizing Maps for Fault Diagnosis of Nonlinear Dynamic Systems", Applications of Self-Organizing Maps (Year: 2012).*

* cited by examiner

ANALOG CIRCUIT FAULT FEATURE EXTRACTION METHOD BASED ON PARAMETER RANDOM DISTRIBUTION NEIGHBOR EMBEDDING WINNER-TAKE-ALL METHOD

CROSS-REFERENCE TO RELATED APPLICATION

This application claims the priority benefit of China application serial no. 201810465480.7, filed on May 16, 2018. The entirety of the above-mentioned patent application is hereby incorporated by reference herein and made a part of this specification.

BACKGROUND OF THE INVENTION

1. Field of the Invention

The invention belongs to the field of manifold learning and electronic engineering, in particular, to a new analog circuit fault feature extraction and dimensionality reduction method based on a parameter random distribution neighbor embedding winner-take-all method.

2. Description of Related Art

The analog circuit is widely applied to equipment such as industrial controllers, instruments and apparatus, as well as consumer electronics. A breakdown at any component in the analog circuit influences lifetime of the equipment and causes function failure, eventually resulting in disastrous consequences. Therefore, it is necessary to study the fault diagnosis technology of the analog circuit.

At present, studies of fault diagnosis method of the analog circuit by domestic and foreign scholars concentrate mainly on feature extraction and fault pattern classification. Currently, the fault feature extraction technology frequently used for the analog circuit mainly comprises: 1) measuring the node voltage of a test node of the analog circuit, and directly regarding same as the fault feature; 2) extracting fault features including peak gain as well as corresponding frequency and phase, DC output voltage, 3 dB cutoff frequency, and the like from a time domain and frequency domain response output by the analog circuit; and 3) acquiring fault features of the circuit by signal process methods such as wavelet analysis, signal envelope analysis and high-order statistical analysis. Although the methods all achieve good effect, there are fewer studies on coexistence of a single fault and multiple faults of the analog circuit, as single-fault and multi-fault features of each component are relatively complex, the difference is less obvious and samples of fault categories are more easily overlapped, resulting in the poor accuracy rate of diagnosis. Therefore, it is necessary to study a more effective feature extraction and process method under single-fault and multi-fault condition of the analog circuit.

SUMMARY OF THE INVENTION

The technical problem to be solved by the invention is to provide an analog circuit fault feature extraction method based on a parameter random distribution neighbor embedding winner-take-all method, aiming at the deficiencies in the application of the existing fault feature extraction technology of the analog circuit. The method extracts a fault response signal of the analog circuit by applying a discrete wavelet packet transform (DWPT), calculates energy and kurtosis data of each wavelet node and used as initial feature data, then uses the parameter random distribution neighbor embedding winner-take-all method to carry out the dimensionality reduction on the feature data to extract an optimum fault feature, thus effectively reduces redundancy and interference elements in the fault features, and greatly improves degree of separation of different fault features and degree of polymerization of samples of same fault category. The technical solution adopted by the invention to solve the technical problem is the following.

An analog circuit fault feature extraction method based on a parameter random distribution neighbor embedding winner-take-all method, comprising the following steps.

(1) Collecting a time-domain response signal of the analog circuit under test, wherein the input of the analog circuit under test is excited by using a pulse signal, a voltage signal is sampled at an output end, and the collected time-domain response signal is the output voltage signal of the analog circuit.

(2) Applying a discrete wavelet packet transform to the collected time-domain response signal to acquire each wavelet node signal.

(3) Calculating energy values and kurtosis values of the acquired wavelet node signals to form an initial fault feature data set of the analog circuit (namely a high-dimensional feature data set).

(4) Analyzing the initial fault feature data formed by the energy values and kurtosis values of each wavelet node signal with the parameter random distribution neighbor embedding winner-take-all method, to acquire the optimum low-dimensional feature data.

According to the solution, in the step (2), the discrete wavelet packet transform specifically comprises applying a four-layer Coiflets 3 wavelet packet decomposition to the collected output voltage signal.

According to the solution, in the step (3), formulae for calculating kurtosis values and energy values are:

$$K = \frac{1}{N}\sum_{i=1}^{N}\left(\frac{x_i - \bar{x}}{\sigma}\right) \text{ and } E = \frac{1}{N}\sum_{i=1}^{N}(x_i)^2,$$

wherein K is a kurtosis value, E is an energy value, N is a total number of the data points in a node signal sequence, $x_i$ is the value of data points, $\bar{x}$ is the mean value of the signal sequence, and $\sigma$ is the standard deviation of the signal sequence.

According to the solution, the specific method of the step (4) is as follows.

For the high-dimensional feature data set $X=[x_1, x_2, \ldots x_N]\in R^{D\times N}$ formed in the step (3), wherein D is a data dimensionality before dimensionality reduction, the data after dimensionality reduction is $Y=[y_1, y_2, \ldots y_N]\in R^{d\times N}$, and d is the data dimensionality after dimensionality reduction, wherein the parameter random distribution neighbor embedding winner-take-all method transforms the distance information between the data in the high dimensional space to a similarity between the data, and recovers the similarity in the low-dimensional space.

Defining the similarity between the data as conditional probability $p_{j/i}$ for the high-dimensional feature data set before dimensionality reduction, wherein the similarity of the data $x_j$ relative to the data $x_i$ is proportional to a probability density of Gaussian distribution by taking $x_i$ as the center:

$$p_{j|i} = \frac{\exp(-\|x_i - x_j\|^2 / 2\sigma_i^2)}{\sum_{k \neq i} \exp(-\|x_i - x_k\|^2 / 2\sigma_i^2)}$$

wherein, $\sigma_i$ represents a variance of the Gaussian distribution by taking $x_i$ as the center.

Obtaining $p_{j|i} = p_{i|j}$ according to symmetry of the data, thereby acquiring:

$$p_{ij} = \frac{p_{j|i} + p_{i|j}}{2}.$$

In order to solve the congestion problem between the data in the low-dimensional space, using a random distribution instead of a Gaussian distribution in the low-dimensional space, wherein the similarity is defined as:

$$q_{ij} = \frac{(1 + \|f(x_i | W) - f(x_j | W)\|^2 / \alpha)^{-\frac{\alpha+1}{2}}}{\sum_{k \neq i}(1 + \|f(x_k | W) - f(x_i | W)\|^2 / \alpha)^{-\frac{\alpha+1}{2}}}$$

wherein f represents dimensionality reduction mapping from the high-dimensional space to the low-dimensional space, that is f(x)=Y, the mapping is defined by a multi-layer forward propagation neural network taking W as weight based on restricted Boltzmann machines (RBMs), and a is the t-distribution degree of freedom.

By taking the joint probability distribution between the data points in the high-dimensional space as P and the joint probability distribution between the data points in the low-dimensional space as Q, a difference between the joint probability distributions P and Q is measured by using Kullback-Leibler divergence, wherein objective function C of the difference is shown as follows:

$$C = \sum_i KL(P_i \| Q_i) = \sum_i \sum_j p_{ij} \log \frac{p_{ij}}{q_{ij}}.$$

wherein the optimization procedure of the objective function C adopts the following iterative formula:

$$Y^{(t)} = Y^{(t-1)} + \eta \frac{\delta C}{\delta y} + a(t)(Y^{(t-1)} - Y^{(t-2)}),$$

wherein in the formula, t is iterations, η is a learning rate, and a(t) is a momentum item at the t-th iterations.

Finally, acquiring the optimum low-dimensional feature data $Y^{(t)} \in R^{d \times N}$ subjected to dimensionality reduction according to the parameter random distribution neighbor embedding winner-take-all method, after t times of iterations.

Compared with the prior art, the invention has the following beneficial effects. The time-domain response signal of the analog circuit is collected, energy and kurtosis data of child nodes are calculated by wavelet packet decomposition and taken as initial feature data, then dimensionality reduction is carried out by using the parameter random distribution neighbor embedding winner-take-all method, thus effectively reducing redundancy and interference elements in the fault features, and greatly improving degree of separation of different fault features and degree of polymerization of samples of same fault category.

DESCRIPTION OF THE EMBODIMENTS

The invention is furthermore described below with reference to the accompanying drawings and embodiments.

Figure 1:
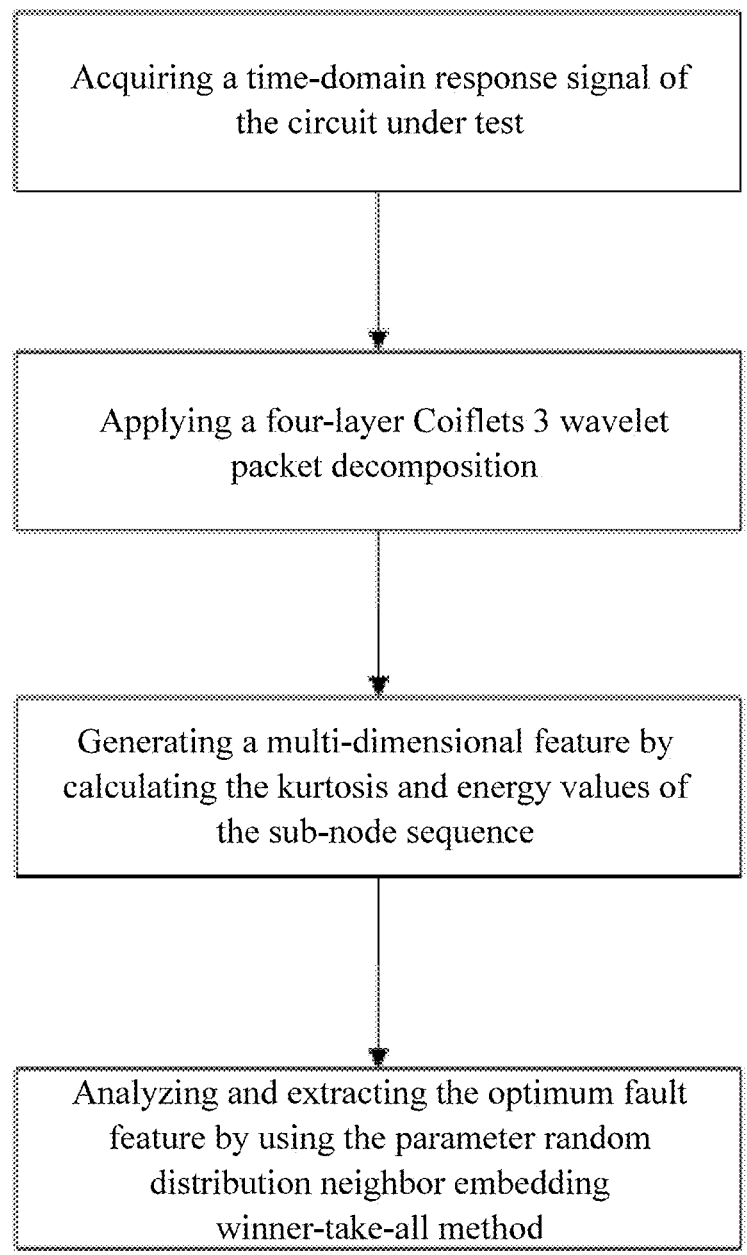
FIG. 1 is a flow chart of the fault feature extraction method for the analog circuit based on the parameter random distribution neighbor embedding winner-take-all method according to the invention.

Referring to FIG. 1, the fault feature extraction method for analog circuit based on parameter random distribution neighbor embedding winner-take-all method according to the invention mainly comprises the following steps.

Step 1: exciting the analog circuit under test by using a pulse signal, collecting a time-domain response signal of the analog circuit under test, and sampling an output voltage signal from the output end of the analog circuit under test.

Step 2: applying a four-layer Coiflets 3 wavelet packet decomposition to the collected fault time-domain response signal to generate 16 fault signal wavelet subsequences, wherein specific calculation method is shown as follows.

The wavelet $\{W^n(x)\}_{n \in Z_+}$ is defined as follows:

$$\begin{cases} W_{2n}(x) = \sqrt{2} \sum_{k=0}^{2N-1} h_k W_{2n}(2x - k) \\ W_{2n+1}(x) = \sqrt{2} \sum_{k=0}^{2N-1} g_k W_{2n}(2x - k) \end{cases}$$

In the formula, $\{h_k\}_0^{2N-1}$ and $\{g_k\}_0^{2N-1}$ respectively represent coefficients of low-pass filters and high-pass filters with the length of 2N, $Z_+$ represents all non-negative integer sets.

The wavelet packet transform coefficient of the signal f(x) in the subspace $\Omega_n^j$, is:

$$C_k^{n,j} = \int_R f(x) 2^{j/2} \overline{W_n(2^j x - k)} dx,$$

wherein in the formula: j=1, 2, ..., N; n=0, 1, 2, ..., $2^{j-1}$; k=1, 2, ..., 2N−1; the bandwidth of the whole band allocation of the signal f(x) is invariable when j is invariable, selecting different n values means that signals pass through different band-pass filters, to acquire a wavelet sub-band sequence signal of the signals.

Step 3: for the 16 wavelet packet node sequences generated by the wavelet packet decomposition, respectively calculate the energy values and kurtosis values corresponding to each node signal, and finally generating the initial fault feature data set with a 32-dimensional feature.

The initial fault feature is calculated as follows.

The wavelet sub-band sequence f(x) is a waveform formed by points $(x_1, x_2, \ldots x_N)^T$, wherein N is the total number of the data points of the node signal sequence, and the kurtosis value K and energy value E of the sub-band subsequence f(x) are calculated by the following formula:

$$K = \frac{1}{N} \sum_{i=1}^{N} \left( \frac{x_i - \bar{x}}{\sigma} \right)$$

and $$E = \frac{1}{N} \sum_{i=1}^{N} (x_i)^2.$$

In the formula, N is a total number of the data points of the node signal sequence, $x_i$ is the value of the data points; x is the mean value of the signal sequence, and σ is the standard deviation of the signal sequence.

Step 4: carrying out dimensionality reduction on the initial fault feature data set by using the parameter random distribution neighbor embedding winner-take-all method, and acquiring the optimum low-dimensional feature data; wherein the parameter random distribution neighbor embedding winner-take-all method is as follows.

For the high-dimensional feature data set $X=[x_1, x_2, \ldots x_N] \in R^{D \times N}$ formed in the step (3), wherein D is the data dimensionality before dimensionality reduction, N is the total number of the data points of the node signal sequence, the data after dimensionality reduction is $Y=[y_1 y_2, \ldots y_N] \in R^{d \times N}$, and d is the data dimensionality after dimensionality reduction. The parameter random distribution neighbor embedding winner-take-all method transforms the distance information between the data in the high dimensional space to the similarity between the data, and recovers the similarity in the low-dimensional space.

Defining the similarity between the data as conditional probability $p_{j|i}$, for the high-dimensional feature data set before dimensionality reduction, wherein the similarity of the data $x_j$ relative to the data $x_i$ is proportional to a probability density of Gaussian distribution by taking $x_i$ as the center:

$$p_{j|i} = \frac{\exp(-\|x_i - x_j\|^2 / 2\sigma_i^2)}{\sum_{k \neq i} \exp(-\|x_i - x_k\|^2 / 2\sigma_i^2)}$$

wherein $\sigma_i$ represents a variance of the Gaussian distribution by taking $x_i$ as the center; Obtaining $p_{j|i} = p_{i|j}$ according to symmetry of the data, thereby acquiring:

$$p_{ij} = \frac{p_{j|i} + p_{i|j}}{2}.$$

In order to solve the congestion problem between the data in the low-dimensional space, using random distribution instead of Gaussian distribution in the low-dimensional space, wherein the similarity is defined as:

$$q_{ij} = \frac{(1 + \|f(x_i | W) - f(x_j | W)\|^2 / \alpha)^{-\frac{\alpha+1}{2}}}{\sum_{k \neq i} (1 + \|f(x_k | W) - f(x_i | W)\|^2 / \alpha)^{-\frac{\alpha+1}{2}}}$$

wherein, f represents dimensionality reduction mapping from the high-dimensional space to the low-dimensional space, that is f(x)=Y, the mapping is defined by a multi-layer forward propagation neural network taking W as weight based on restricted Boltzmann machines (RBMs), and a is a random distribution degree of freedom.

By taking the joint probability distribution between the data points in the high-dimensional space as P and the joint probability distribution between the data points in the low-dimensional space as Q, a difference between the joint probability distributions P and Q is measured by using Kullback-Leibler divergence, wherein objective function C of the difference is shown as follows:

$$C = \sum_i KL(P_i \| Q_i) = \sum_i \sum_j p_{ij} \log \frac{p_{ij}}{q_{ij}}.$$

wherein the optimization procedure of the objective function C adopts a following iterative formula:

$$Y^{(t)} = Y^{(t-1)} + \eta \frac{\delta C}{\delta y} + a(t)(Y^{(t-1)} - Y^{(t-2)})$$

wherein, t is iterations, η is learning rate, and a(t) is the momentum term at the t-th iterations.

Finally, acquiring the optimum low-dimensional feature data $Y^{(t)} \in R^{d \times N}$ subjected to dimensionality reduction according to the parameter random distribution neighbor embedding winner-take-all method, after t times of iterations.

In order to show the process and performance of the fault feature extraction method for the analog circuit according to the invention, an example is illustrated here.

Figure 2:
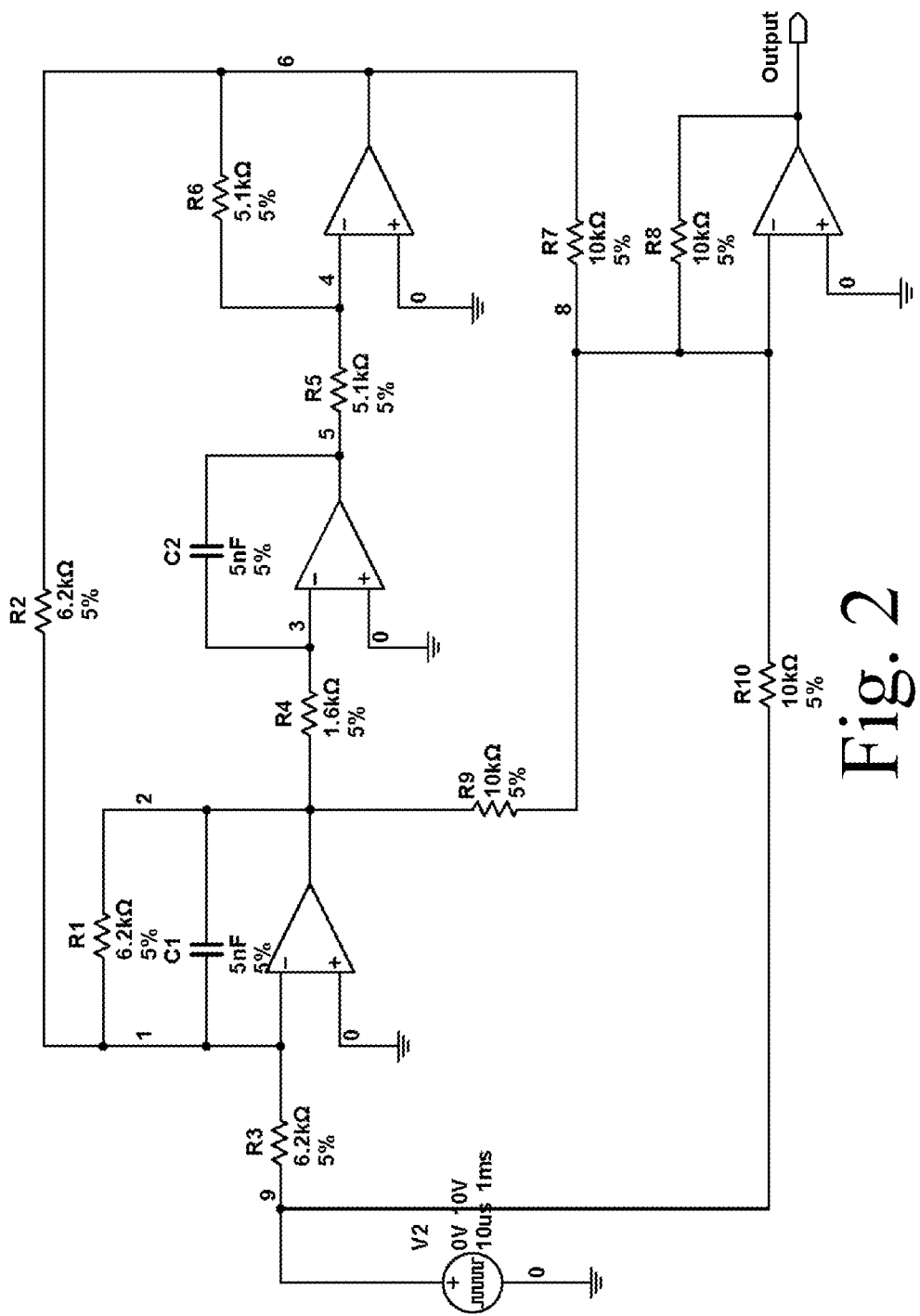
FIG. 2 is a circuit diagram of a four-operational-amplifier bi-quad high-pass filter.

FIG. 2 shows a four-operational-amplifier bi-quad high-pass filter, wherein nominal values of each component are all marked thereon. The impulse wave with the amplitude of 10V, lasting time of 10 us and period of 1 ms is used for excitation. The fault time-domain response signal is acquired at the output end of the circuit under test. The tolerance of the resistors and capacitors is set as 5%. Fault codes, fault categories and fault values of each component under test in the circuit are shown in Table 1, wherein ↑ and ↓ respectively represent that the data is higher or lower than the nominal value, NF represents that no fault exists.

TABLE 1

Single and Multiple Faults List of Four-Operational-Amplifier Bi-Quad High-Pass Filter

| Fault code | Fault category | Fault value | Fault code | Fault category | Fault value |
|---|---|---|---|---|---|
| F1 | R1↓ | 3 kΩ | F2 | R1↑ | 15 kΩ |
| F3 | R2↓ | 2 kΩ | F4 | R2↑ | 18 kΩ |
| F5 | R3↓ | 2.7 kΩ | F6 | R3↑ | 12 kΩ |
| F7 | R4↓ | 0.5 kΩ | F8 | R4↑ | 2.5 kΩ |
| F9 | C1↓ | 2.5 nF | F10 | C1↑ | 10 nF |
| F11 | C2↓ | 1.5 nF | F12 | C2↑ | 15 nF |
| F13 | C1↑C2↓ | above | F14 | C2↓R1↑ | above |
| F15 | R1↓R2↓ | above | F16 | R2↑R4↓ | above |

Figure 3:
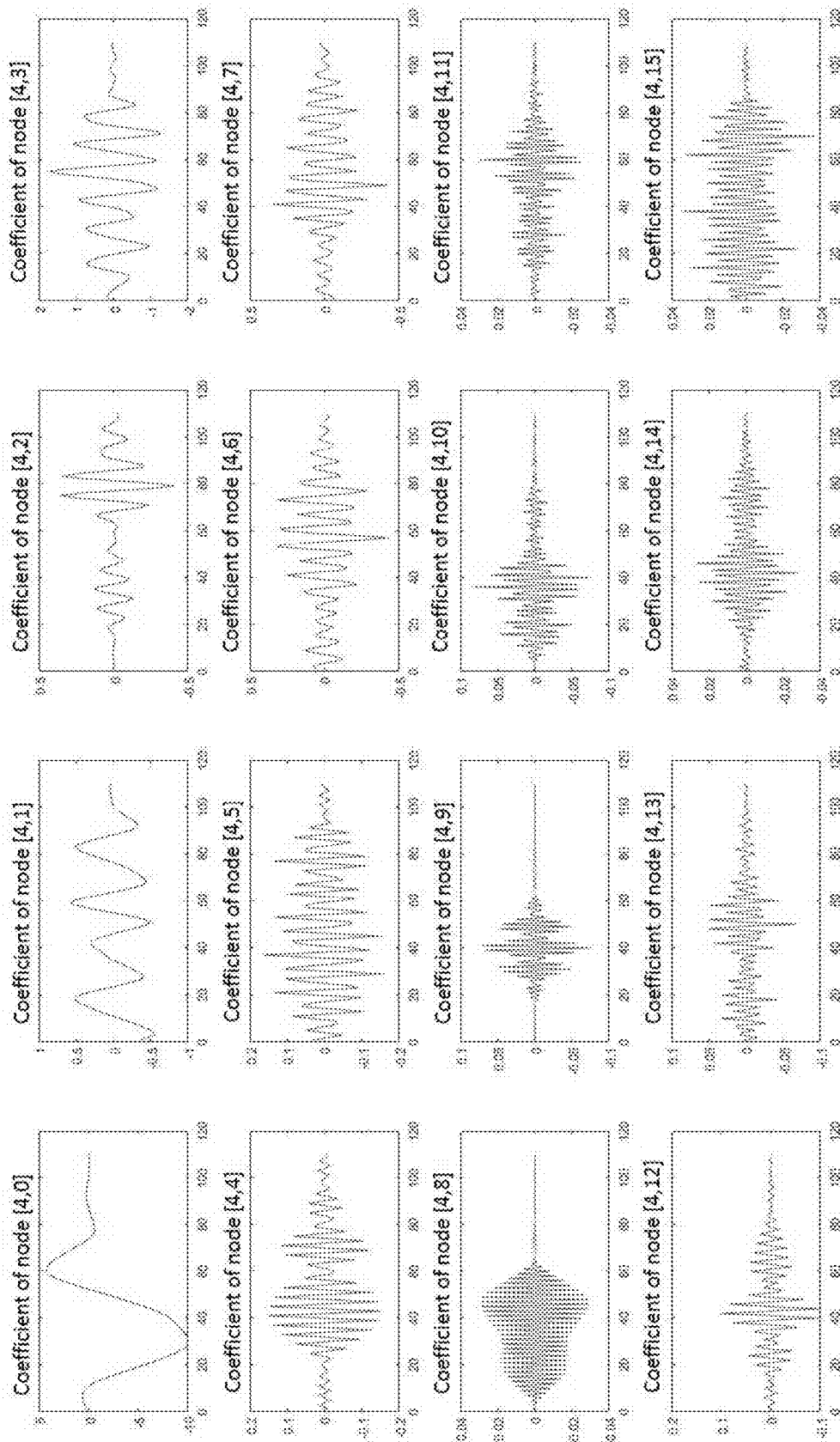
FIG. 3 is an analysis diagram of the four-layer wavelet packet.
Figure 4:
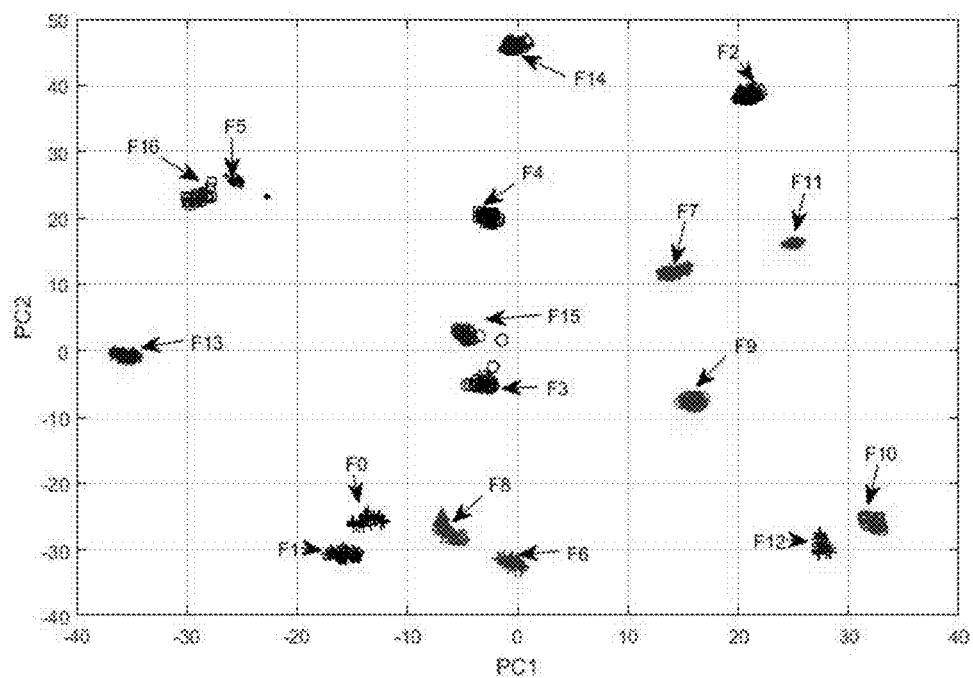
FIG. 4 is a two-dimensional distribution diagram of fault features after dimensionality reduction by the parameter random distribution neighbor embedding winner-take-all method.
Figure 5:
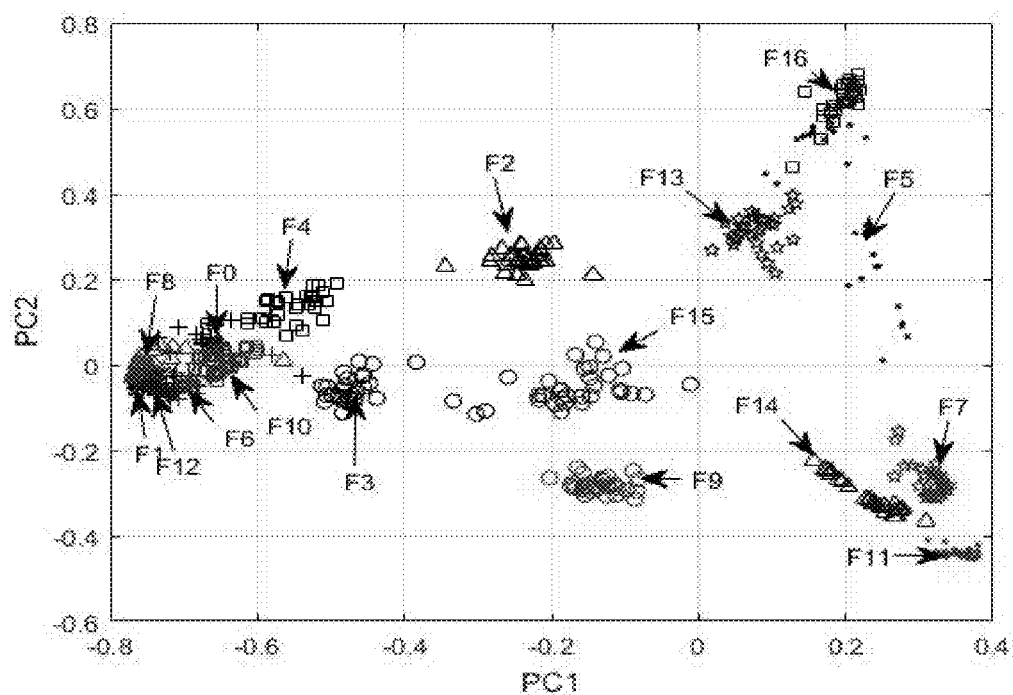
FIG. 5 is a two-dimensional distribution diagram of fault features after dimensionality reduction based on kernel principal component analysis.
Figure 6:
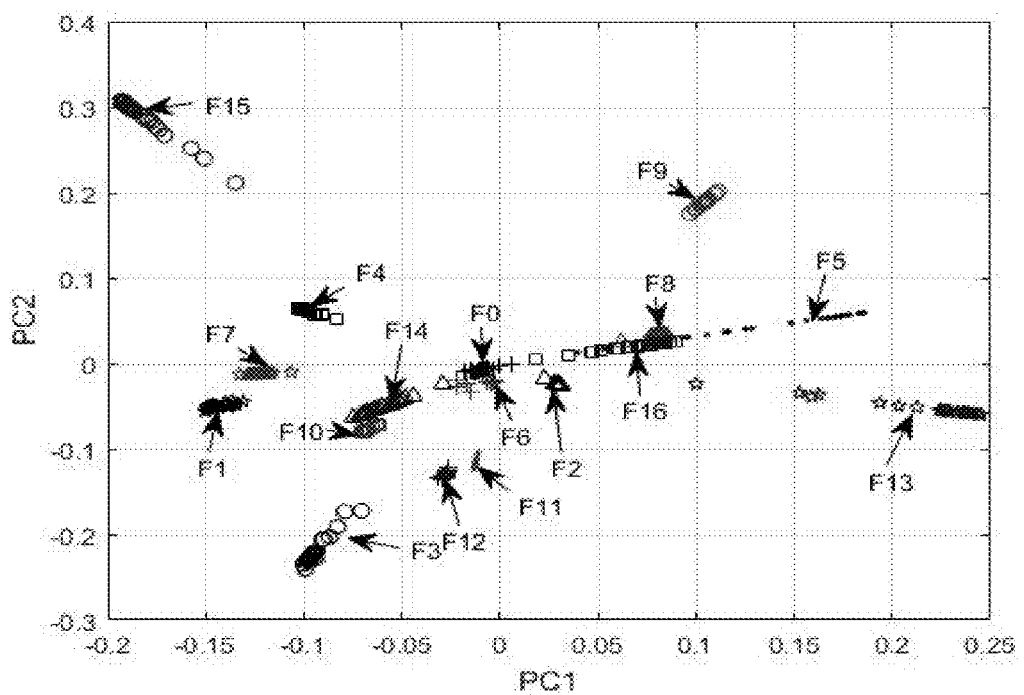
FIG. 6 is a two-dimensional distribution diagram of fault features after dimensionality reduction based on kernel discriminant analysis.

The sampling period is set as 1 ms and the fault signal length from sampling is 110. For each fault category in the circuit under test, 60 times of Monte Carlo analysis are performed, that is, each fault category has 60 fault response signals, therefore a data set with 1020 fault signal samples is acquired. Then, the four-layer Coiflets 3 wavelet packet decomposition is applied to each signal in the sample data set to acquire the wavelet coefficient sequence corresponding to each fault signal. FIG. 3 shows graphs of 16 node subsequence signals acquired after applying the four-layer Coiflets 3 wavelet analysis to one fault response time-domain signal when component R2 has an R2↓, F3 fault. The kurtosis and energy values of the wavelet coefficient sequence of each fault sample are respectively calculated, thereby acquiring the data with a 32-dimension feature. After the wavelet analysis and kurtosis and energy calculation is applied to all the fault time-domain response signals, the initial primitive feature data set is formed. The parameter random distribution neighbor embedding winner-take-all method is applied to carry out dimensionality reduction for the 32-dimensional initial feature data. The dimensionality of the initial feature is reduced from 32 to 2 for the purpose of convenient visualization and comparison. FIG. 4 shows the two-dimensional feature distribution of different fault categories after dimensionality reduction based on the parameter random distribution neighbor embedding winner-take-all method. As shown in the figure, separations between different fault categories are very clear, and the samples of same fault category are rather close. The kernel principal component analysis and kernel discriminant analysis methods are widely applied to dimensionality reduction of the high-dimensional data. In order to compare the effect after the dimensionality reduction by the parameter random distribution neighbor embedding winner-take-all method, the 32-dimensional feature extracted by the invention is reduced to 2-dimensional feature by applying the kernel principal component analysis and kernel discriminant analysis methods. The effect is shown in the FIGS. 5 and 6. It can be seen that severe there is a serious overlap between many fault categories and the samples of same fault category are relatively dispersed. To sum up, the parameter random distribution neighbor embedding winner-take-all method provided by the invention is obviously better than the kernel principal component analysis and kernel discriminant analysis methods in feature extraction and dimensionality reduction.

Those skilled in the art can make various modifications and variations to the present invention. The modifications and variations are also in the protection range of the present invention if the modifications and variations are in the range of the claims of the present invention and equivalent technologies thereof. The content not described in detail in the description is the prior art well known by those skilled in the art.

What is claimed is:

1. An analog circuit fault feature extraction method based on a parameter random distribution neighbor embedding winner-take-all method, comprising:
   (1) collecting a time-domain response signal of an analog circuit under test, wherein the input of the analog circuit under test is excited by using a pulse signal, a voltage signal is sampled at an output end, and the collected time-domain response signal is an output voltage signal of the analog circuit;
   (2) applying a discrete wavelet packet transform to the collected time-domain response signal to acquire each wavelet node signal;
   (3) calculating energy values and kurtosis values of the acquired wavelet node signals to form an initial fault feature data set of the analog circuit;
   (4) analyzing the initial fault feature data formed by the energy values and kurtosis values of each wavelet node signal with the parameter random distribution neighbor embedding winner-take-all method, to acquire optimum low-dimensional feature data; and
   (5) using the optimum low-dimensional feature data to separate at least one fault categories, to improve an accuracy rate of an analog circuit fault diagnosis.

2. The analog circuit fault feature extraction method based on the parameter random distribution neighbor embedding winner-take-all method according to claim 1, wherein, in the step (2), the discrete wavelet packet transform specifically comprises applying four-layer Coiflets 3 wavelet packet decomposition to the collected output voltage signal.

3. The analog circuit fault feature extraction method based on the parameter random distribution neighbor embedding winner-take-all method according to claim 1, wherein, in the step (3), formulae for calculating kurtosis values and energy values are:

$$K = \frac{1}{N}\sum_{i=1}^{N}\left(\frac{x_i - \bar{x}}{\sigma}\right)$$

and $$E = \frac{1}{N}\sum_{i=1}^{N}(x_i)^2,$$

wherein K is a kurtosis value, E is an energy value, N is a total number of data points in a node signal sequence, $x_i$ is the value of the data points, $\bar{x}$ is the mean value of the signal sequence, and $\sigma$ is the standard deviation of the signal sequence.

4. The analog circuit fault feature extraction method based on the parameter random distribution neighbor embedding winner-take-all method according to claim 3, wherein the specific method of the step (4) comprises:
   for the high-dimensional feature data set $X=[x_1, x_2, \ldots x_N]\in R^{D\times N}$ formed in the step (3), wherein D is a data dimensionality before dimensionality reduction, the data after dimensionality reduction is $Y=[y_1, y_2, \ldots y_N]\in R^{d\times N}$, and d is a data dimensionality after dimensionality reduction, wherein the parameter random distribution neighbor embedding winner-take-all method transforms the distance information between the data in the high dimensional space to a similarity between the data, and recovers the similarity in a low-dimensional space;

defining the similarity between the data as conditional probability $p_{j|i}$ for the high-dimensional feature data set before dimensionality reduction, wherein a similarity of the data $x_j$ relative to the data $x_i$ is proportional to a probability density of Gaussian distribution by taking $x_i$ as the center:

$$p_{j|i} = \frac{\exp(-\|x_i - x_j\|^2 / 2\sigma_i^2)}{\sum_{k \neq i} \exp(-\|x_i - x_k\|^2 / 2\sigma_i^2)}$$

wherein $\sigma_i$ represents a variance of the Gaussian distribution by taking $x_i$ as the center;

obtaining $p_{j|i} = p_{i|j}$ according to symmetry of the data, thereby acquiring:

$$p_{ij} = \frac{p_{j|i} + p_{i|j}}{2};$$

in order to solve the congestion problem between the data points in the low-dimensional space, using a random distribution instead of a Gaussian distribution in the low-dimensional space, wherein the similarity is defined as:

$$q_{ij} = \frac{(1 + \|f(x_i | W) - f(x_j | W)\|^2 / \alpha)^{-\frac{\alpha+1}{2}}}{\sum_{k \neq i} (1 + \|f(x_k | W) - f(x_i | W)\|^2 / \alpha)^{-\frac{\alpha+1}{2}}},$$

wherein f represents dimensionality reduction mapping from the high-dimensional space to the low-dimensional space, that is $f(x)=Y$, the mapping is defined by a multi-layer forward propagation neural network taking W as weight based on a restricted Boltzmann machine, and a is a random distribution degree of freedom;

by taking the joint probability distribution between the data points in the high-dimensional space as P and the joint probability distribution between the data points in the low-dimensional space as Q, a difference between the joint probability distributions P and Q is measured by using Kullback-Leibler divergence, wherein an objective function C of the difference is shown as follows:

$$C = \sum_i KL(P_i \| Q_i) = \sum_i \sum_j p_{ij} \log \frac{p_{ij}}{q_{ij}},$$

wherein the optimization procedure of the objective function C adopts a following iterative formula:

$$Y^{(t)} = Y^{(t-1)} + \eta \frac{\delta C}{\delta y} + a(t)(Y^{(t-1)} - Y^{(t-2)})$$

wherein in the formula, t is the iterations, $\eta$ is a learning rate, and $a(t)$ is a momentum item at the tth iterations; and finally acquiring the optimum low-dimensional feature data $Y^{(t)} \in R^{d \times N}$ subjected to dimensionality reduction according to the parameter random distribution neighbor embedding winner-take-all method, after t times of iterations.

* * * * *